United States Patent
Mandelman et al.

(10) Patent No.: US 6,635,525 B1
(45) Date of Patent: Oct. 21, 2003

(54) METHOD OF MAKING BACKSIDE BURIED STRAP FOR SOI DRAM TRENCH CAPACITOR

(75) Inventors: Jack A. Mandelman, Stormville, NY (US); Herbert L. Ho, Cornwall, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/161,960

(22) Filed: Jun. 3, 2002

(51) Int. Cl.[7] .......................................... H01L 21/8242
(52) U.S. Cl. ...................................... 438/243; 438/246
(58) Field of Search ................................ 257/301, 304, 257/302, 296, 303; 438/243, 246, 592; 437/52; H01L 27/108

(56) References Cited

U.S. PATENT DOCUMENTS

| | | | |
|---|---|---|---|
| 5,525,531 A | * 6/1996 | Bronner et al. | 437/52 |
| 5,674,769 A | * 10/1997 | Alsmeier et al. | 437/52 |
| 5,905,279 A | * 5/1999 | Nitayama et al. | 257/301 |
| 6,063,657 A | 5/2000 | Bronner et al. | |
| 6,066,527 A | 5/2000 | Kudelka et al. | |
| 6,140,673 A | * 10/2000 | Kohyama | 257/301 |
| 6,177,698 B1 | * 1/2001 | Gruening et al. | 257/302 |
| 6,184,107 B1 | 2/2001 | Divakaruni et al. | |
| 6,204,112 B1 | 3/2001 | Chakravarti et al. | |
| 6,232,170 B1 | 5/2001 | Hakey et al. | |
| 6,238,967 B1 | 5/2001 | Shiho et al. | |

FOREIGN PATENT DOCUMENTS

| | | | | |
|---|---|---|---|---|
| DE | 0 703 625 A2 | * 3/1996 | | H01L/27/108 |
| WO | WO 00/13225 | 3/2000 | | |

OTHER PUBLICATIONS

US patent Application Publication US 2002/0076880 by Yamada et al.*

* cited by examiner

Primary Examiner—David Nelms
Assistant Examiner—Thinh T. Nguyen
(74) Attorney, Agent, or Firm—Jay H. Anderson

(57) ABSTRACT

In SOI integrated circuits having trench capacitor DRAM arrays, the decreasing thickness of the insulating layer causes cross-talk between the passing wordline traveling over the trench capacitor. Increasing the depth of the recess at the top of the trench and undercutting the insulating layer laterally permits the buried strap from the capacitor center electrode to make contact to the back side of the SOI layer, thereby increasing the vertical separation between the passing wordline and the strap.

9 Claims, 10 Drawing Sheets

METHOD OF MAKING BACKSIDE BURIED STRAP FOR SOI DRAM TRENCH CAPACITOR

TECHNICAL FIELD

The field of the invention is that of DRAM arrays on SOI wafers, in particular for ultra-thin insulating layers.

BACKGROUND OF THE INVENTION

In SOI circuits having trench capacitor DRAM arrays, the capacitor is connected to the pass transistor through a buried strap that makes electrical contact with the device layer at a vertical surface abutting the capacitor trench.

The conventional DRAM layout, in which cells are staggered so that "passing wordlines" pass over trench capacitors in adjacent rows of the array, is satisfactory as long as the thickness of the insulator between the passing wordline and the capacitor is great enough to suppress coupling (including shorts). In the development of advanced devices, however, the decreasing thickness of the device layer has caused the thickness of the trench top oxide (TTO) to decrease correspondingly, so that it is no longer possible to retain the passing wordline layout with conventional manufacturing tolerances.

Continued use of the conventional DRAM cell structure would thus require that the cell layout for SOI circuits with thin device layers be changed, increasing the overall size of the DRAM cell.

The art would benefit from a DRAM cell structure that retains the advantages of a thin device layer while still permitting the passing wordlines to pass over the trenches in adjacent rows.

SUMMARY OF THE INVENTION

The invention relates to a DRAM cell structure for SOI technology in which the buried strap makes contact with the bottom of the device layer.

A feature of the invention is the recess of the trench center electrode to a depth within a manufacturing tolerance of the bottom of the device layer.

Another feature of the invention is an isotropic etch to expand the trench laterally to undercut the device layer with an expanded aperture.

Another feature of the invention is filling the expanded aperture with a conformal conductor.

Yet another feature of the invention is coating the surfaces of the expanded aperture with a conductive material before the filling step.

DETAILED DESCRIPTION OF PREFERRED EMBODIMENTS

Figure 7:
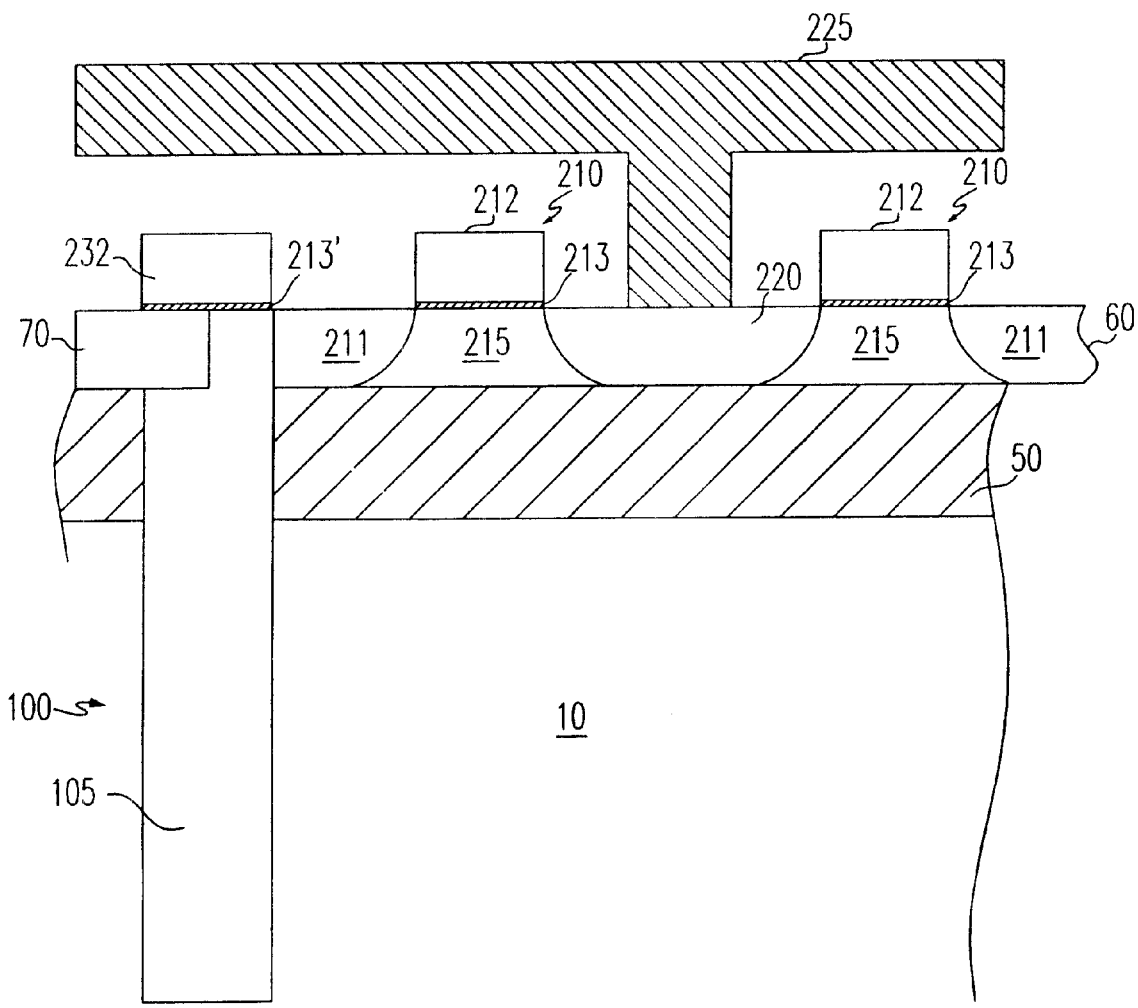
FIG. 7 shows in cross section a conventional DRAM cell.

Referring now to FIG. 7, there is shown in cross section a portion of a typical DRAM SOI cell. Trench 100 has been etched into substrate 10 through silicon device layer 60 (~35 nm thick) and buried oxide (BOX) 50 (100–300 nm thick), illustratively to a depth of several microns. An insulator, e.g. oxide or oxide-nitride has been deposited conformally inside the trench and doped poly center electrode 105 has been deposited. At the top left of the trench, shallow trench isolation (STI) 70 separates the cell from other portions of the circuit. To the right of the trench, a portion of silicon device layer 60 has formed in it two FETs 210. The FET in the center of the Figure is connected to trench capacitor 100 through doped poly strap 211. Strap 211 is one electrode of transistor 210, diffusion 220 being the other. Gate insulator 213 and gate 212 complete transistor 210.

Diffusion 220 is shared with both cells, being in common with both transistors 210. It will be the bitline contact, making electrical contact with bitline 225, shown extending left and right to contact other cells in the array.

Gates 212 are also wordlines, extending perpendicular to the plane of the paper to make contact with other cells. On the left of FIG. 7, poly 232, referred to as a "passing wordline," extends to make contact with cells before and behind the plane of the paper, in a conventional folded bitline array layout. This geometrical arrangement is used so that adjacent bitlines can go to opposite sides of the sense amplifiers and thus have improved common mode noise rejection.

The problem addressed by the present invention is that the insulation between the passing wordline 232 and the center electrode is only the thin gate oxide 213', which has the same thickness as the gate oxide 213 of transistors 210. In current technology, the thickness of the SOI layer is so small that manufacturing tolerances in recess control do not permit filling this area with insulator.

When the thickness of the device layer becomes less than about 100 nm, the manufacturing tolerances (+/−35 nm for a 100 nm device layer) can combine such that the thickness allowed to fill with TTO is too thin to reliably isolate the passing wordline from the trench electrode. In that case, it is necessary to change the layout from the compact version illustrated here to a larger one that displaces the passing wordline from the trench.

Figure 1:
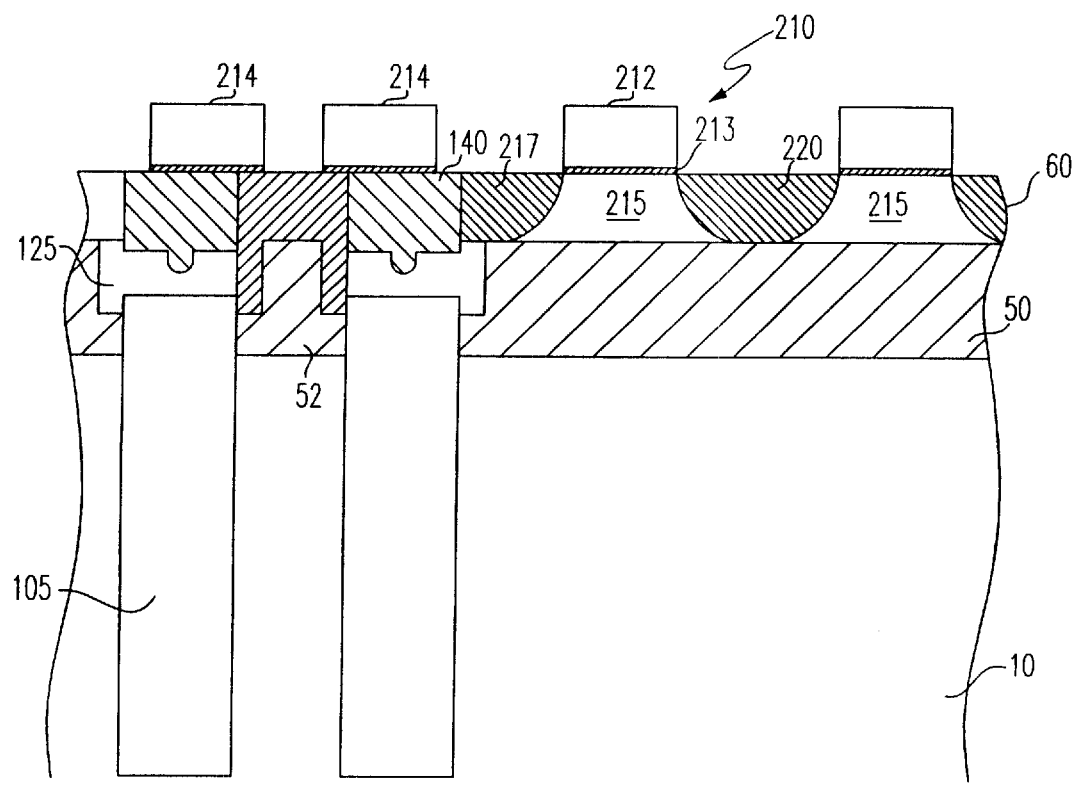
FIG. 1 shows in cross section a DRAM cell fabricated according to an embodiment of the invention.

Referring now to FIG. 1, there is shown the result of the inventive process, in which center electrode 105 is recessed to about midway through BOX 50 and an expanded trench aperture is formed by isotropic etching. This expanded aperture extends laterally nominally 25 nm, to make contact with the bottom side (backside) of device layer 60. The trench top oxide can now be the full thickness of device layer 60, giving an ample safety margin for insulation. The following figures illustrate steps in the process.

Figure 2:
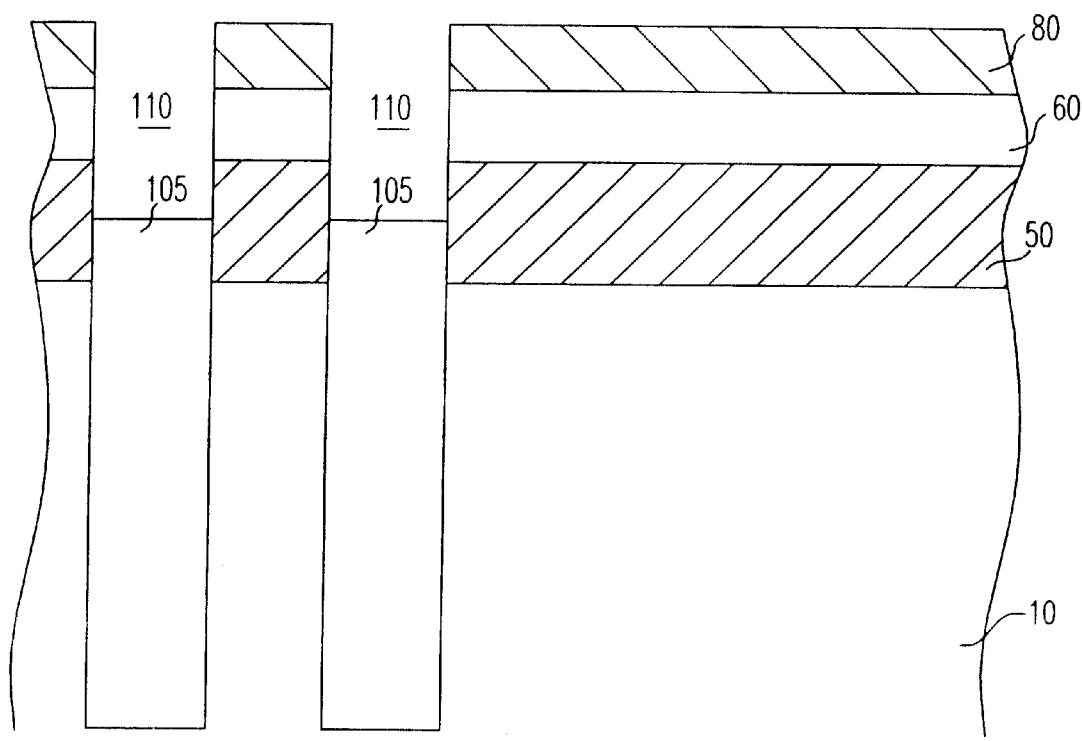
FIGS. 2 through 6 show intermediate steps in the construction of the cell of FIG. 1.

Starting out with a standard SOI wafer having a preferred BOX thickness of about 200 nm and a P-type device layer thickness of 35 nm, standard pad layers are formed: e.g. thin thermal oxide, deposited nitride 80 (100–300 nm) and CVD oxide (500–1000 nm). The BOX thickness will vary depending on the technology used to produce the wafer. For SIMOX wafers, the BOX ranges 100–500 nm. For bonded wafers, the BOX ranges 10–300 nm. Deep storage trenches are etched through the SOI, BOX and into the substrate. In the course of the etching, most of the CVD oxide is consumed. Standard trench capacitor processing is performed, including a plate outdiffusion if desired, capacitor dielectric lining (e.g. oxy-nitride) deposition of (N$^+$) doped poly. The plate and node dielectric are omitted from the drawings for simplicity. The center electrode material 105 is recessed to a depth nominally in the midpoint of BOX 50, leaving apertures 10 to be filled with the strap and then with insulator. The result is shown in FIG. 2, in which the trench extends through pad nitride 80, SOI 60, BOX 50 and into substrate 10.

Figure 3:
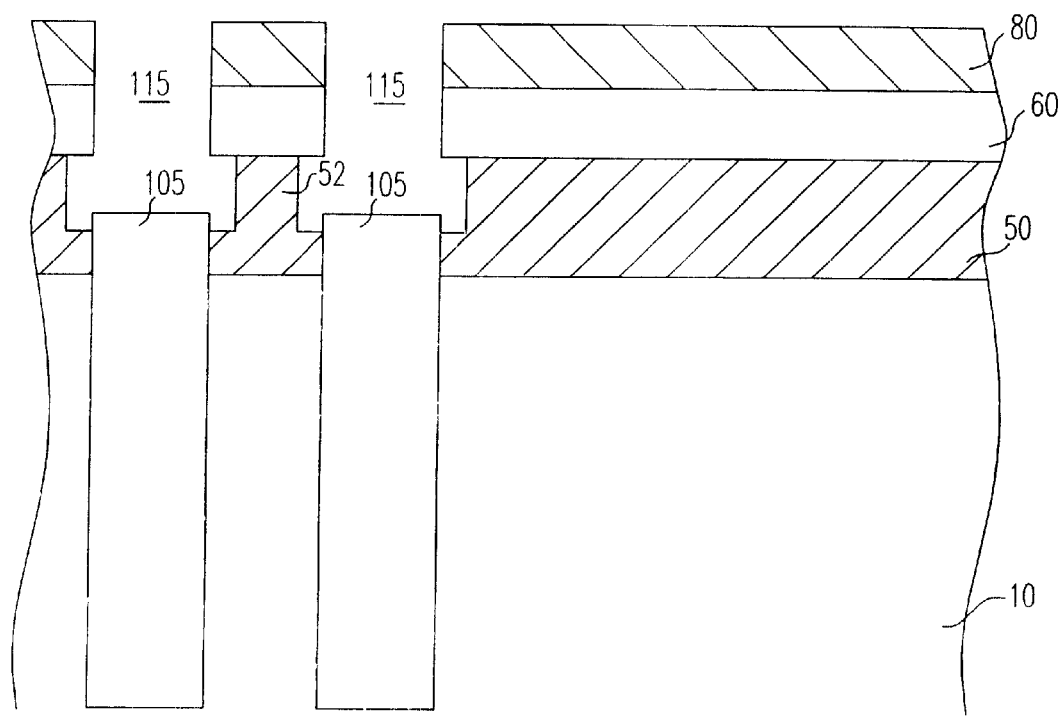

Next, an isotropic etch attacking the BOX in preference to silicon expands aperture 10 laterally to form expanded aperture 115 (see FIG. 3). An plug of oxide 52 (shown in the Figure as having an inverted T shape) remains after this etching step. A requirement for this etch is that it produce a clean surface on the bottom (that is, the underside or backside) of layer 60, suitable for making electrical contact between the buried strap and the device layer. Suitable etches are a wet etch, such as HF and an isotropic dry etch, such as a fluorine containing gas such as $SF_6$, $NF_3$, $CF_4/O_2$, $CF_4$. Standard works such as "Silicon VLSI Technology," Plummer, Deal, Griffin (Prentice-Hall, 2000), pp. 644–647, discuss the etching properties of various gases.

Illustratively, for a ground rule of 100 nm, the expanded aperture 115 extends laterally by 25 nm under device layer 60 to give a sufficiently large bottom contact area, without risk of shorting through oxide plug 52 to the adjacent aperture on the left. As ground rules change, the tolerances required for a safety margin will charge correspondingly. Note that the bottom corners of aperture 115 extend down toward substrate 10. It is a requirement on the depth of the recess and the etch process that the buried strap not be allowed to short to the substrate. The result is shown in FIG. 3.

Figure 4:
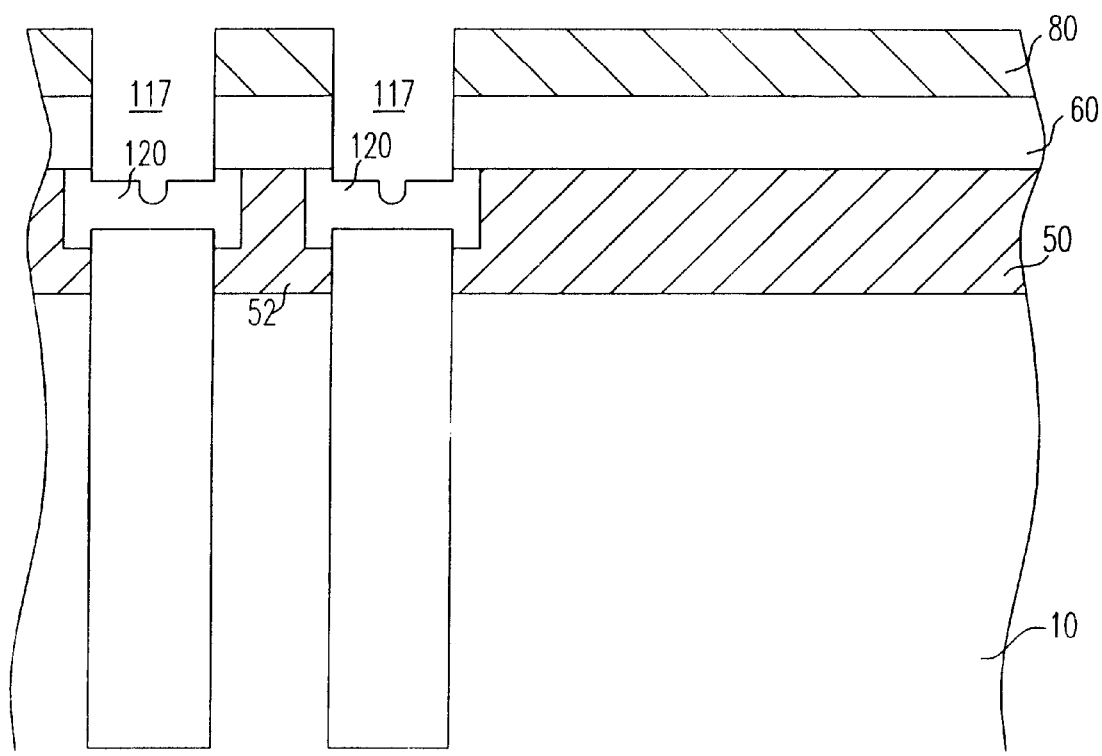

Next, strap 120 is formed by deposition of conductive poly ($N^+$) in aperture 115 (see FIG. 4). The poly is recessed by a directional etch that does not affect the contact at the bottom surface of layer 60, leaving aperture 117 that extends slightly down below SOI layer 60. This recess serves to keep the strap diffusion away from the top surface. In addition, if the strap material is in contact with the vertical surface of the device layer, there may be diffusion from the strap that would adversely affect the transistor characteristics (i.e. short channel effects, junction leakage, etc.).

It is an advantageous feature of the invention that the depth of this recess is non-critical because the thickness of the remaining poly strap in the center does not have a significant effect on the current flow in and out of the capacitor.

Figure 5:
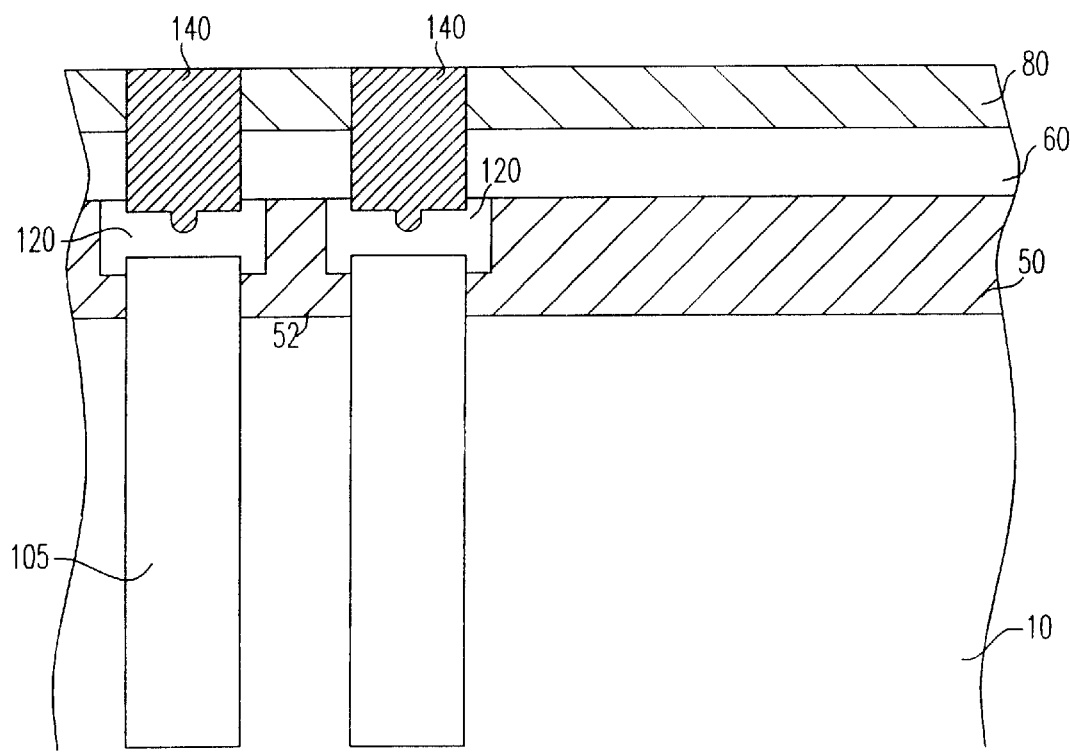

Next, as shown in FIG. 5, a convenient material, such as CVD or HDP oxide 140, is deposited and planarized to the same level as pad nitride 80.

Figure 6:
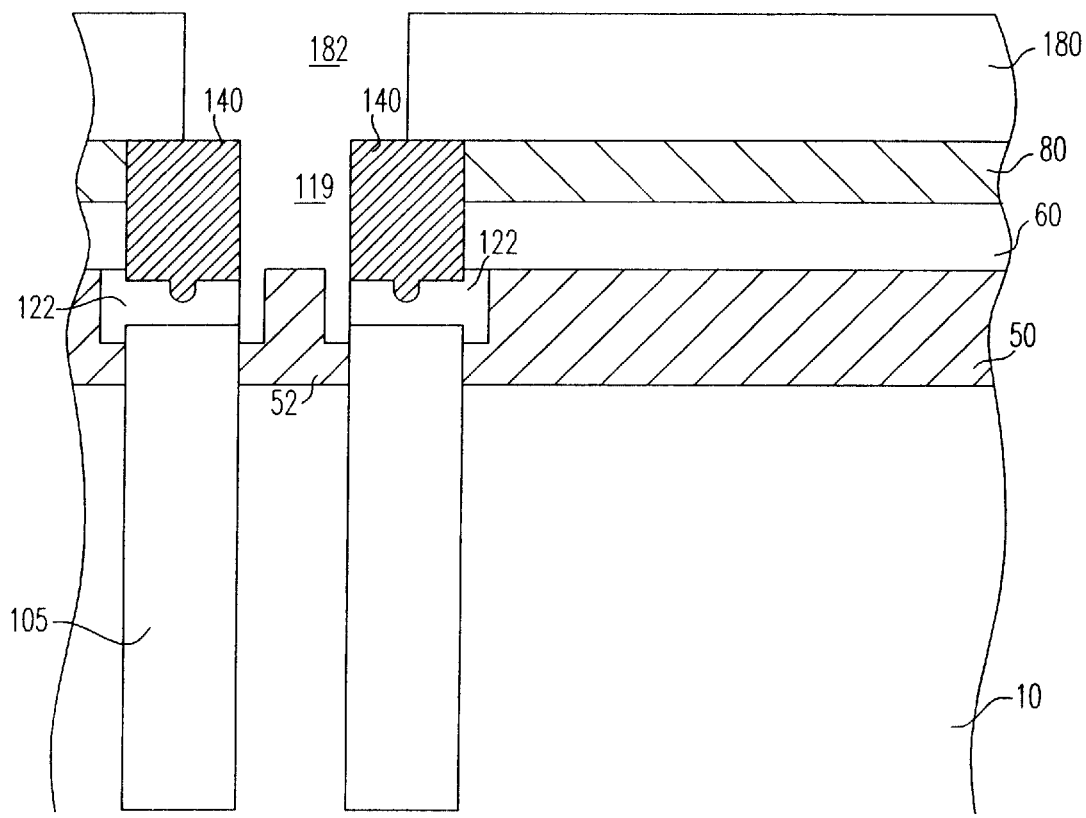

Photoresist 180 is then deposited and patterned to form aperture 182. An etch is then performed that attacks pad nitride 80 and SOI 60 in preference to BOX 50 and oxide fill 140, and cleans the poly material of the buried strap out of the area between the trenches (see FIG. 6). This step forms the isolating trenches of shallow trench isolation (STI) extending through the device layer. The expanded aperture extends before and behind the plane of the paper as well as left and right. The isolating trenches remove all of the device layer except for the active area, so that the portion of the buried straps outside the active area and the trench are trimmed. The dimensions of aperture 182 are chosen such that the strap remains only where it overlies the trench poly and overlaps the active area; i.e. all of the strap outside the trench is removed. The result is shown in FIG. 6. The purpose of this step is to prevent leakage between adjacent cells through the SOI.

The area removed in the previous step is filled with oxide and planarized to form the STI between cells. Transistors are formed in the device layer to complete the cells, as shown in FIG. 1. The passing wordlines 214 in FIG. 1 have been shown as displaced in order to illustrate a benefit of the invention—that the wide and thick insulator provided by this invention is very tolerant to the alignment between the trench capacitors and the passing wordlines.

Figure 8:
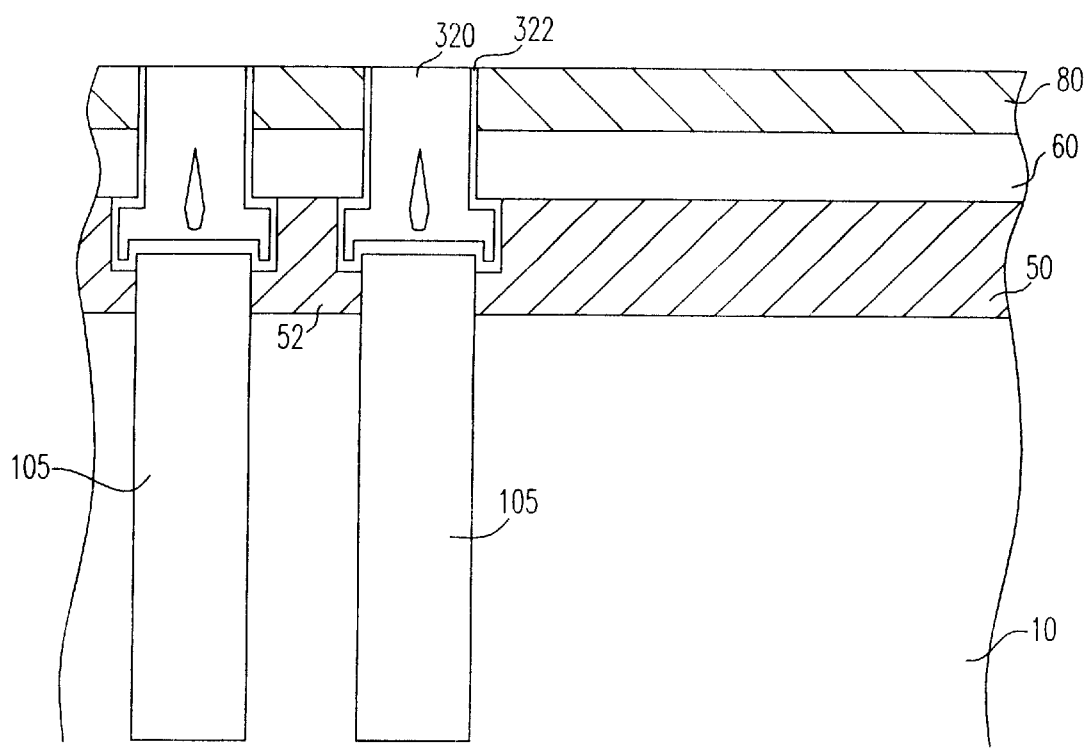
FIGS. 8 through 10 show corresponding steps in an alternative embodiment of the invention.

Referring now to FIG. 8, there is shown the result of steps in an alternative embodiment in which, before deposition of poly for the buried strap, a conductive liner 322 of metallic nitride (e.g. WN, TiN) or other low resistance material has been deposited conformally by CVD. This version has the advantage that a material can be selected that deposits more conformally and/or bonds to the SOI layer 60 better than the doped poly material of the first embodiment—i.e. that the improvement in adhesion and conductivity is worth the extra cost of this step. The thickness of layer 322 is a nominal 5 nm. After this step, amorphous or poly silicon 320 is deposited as in the first embodiment.

Figure 9:
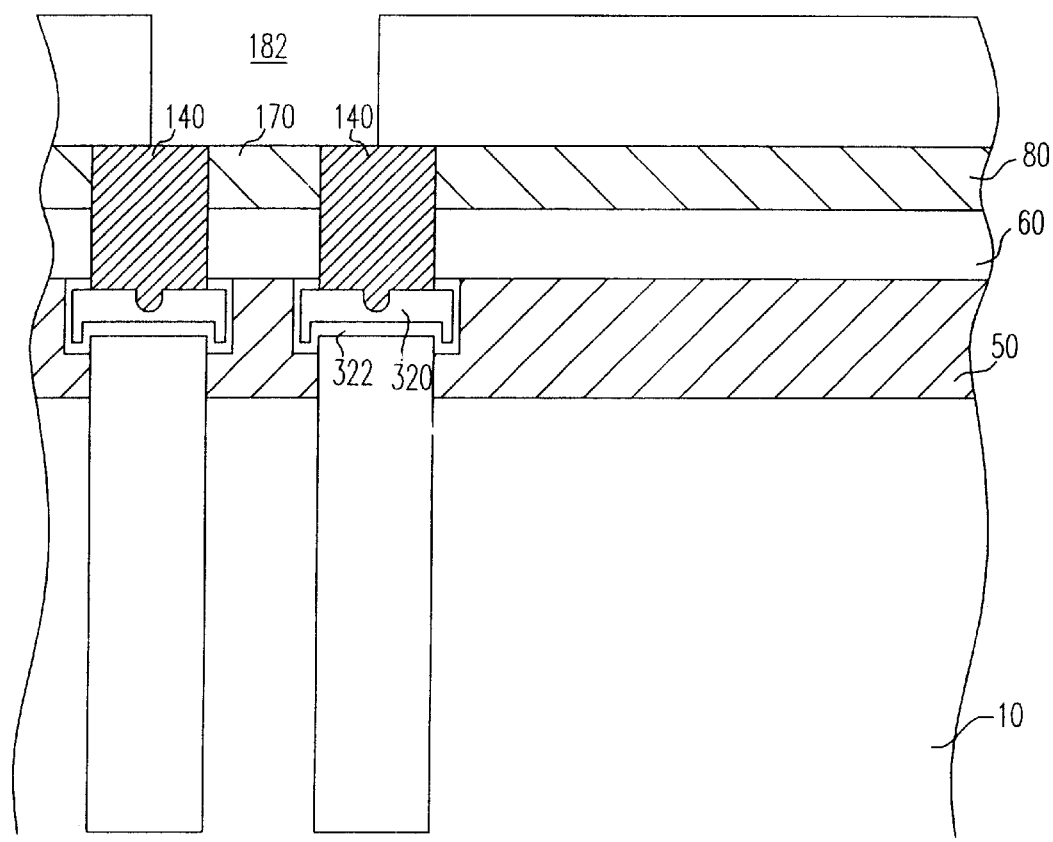

As in FIG. 5 of the first embodiment, liner 322 and poly 320 are recessed and the aperture is filled with oxide 140 and planarized. FIG. 9 shows the result of the planarization step, plus the deposition and patterning of photoresist 180 with the same aperture 182 as in the first embodiment. Note in FIG. 9 that, since the liner makes contact with the bottom (underside or backside) of SOI layer 60, an etch chemistry that attacks poly 320 in preference to liner 322 reduces the chance that the etchant will extend its attack laterally. An anisotropic etch is preferred so that the liner remains intact.

Preferred etchants are HBr, $Cl_2$, $Cl_2/HBr/O_2$. Other dry etch gases such as $SF_6$ or $CF_4$ or wet etchants such as $HNO_3:H_2O:HF(+CH_3COOH)$ may be used.

Figure 10:
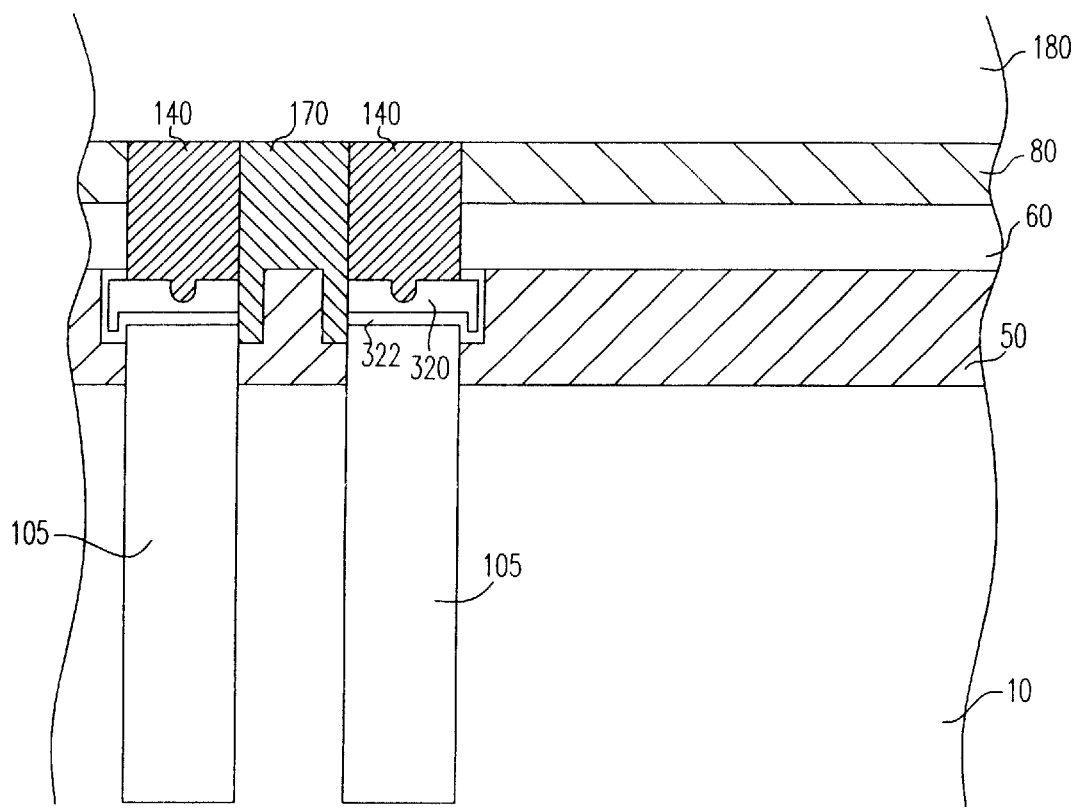

FIG. 10 shows the result of cleaning out the exposed nitride pad, 80, SOI and liner and strap outside the area of the trench, then filling with oxide 170 and leaving a solid plug of dielectric 140 surrounded by the oxide 170 of the STI. Pad nitride 80 will be stripped, transistors will be formed in SOI layer 60 and interconnections will be formed to complete the circuit, as in the first embodiment.

While the invention has been described in terms of two preferred embodiments, those skilled in the art will-recognize that the invention can be practiced in various versions within the spirit and scope of the following claims.

What is claimed is:

1. A method of making an integrated circuit having a device layer of semiconductor with a device layer thickness of less than 100 nm above an array insulating layer and containing an array of DRAM cells disposed in a first subset of DRAM cells and a second subset of DRAM cells, including a trench capacitor formed at an edge of said DRAM cells and connected by a buried strap to a horizontal pass transistor formed in said device layer and displaced laterally from said trench capacitor, comprising the steps of:

forming said set of trench capacitors by etching trenches through said device layer and array insulating layer and depositing center electrodes insulated by a capacitor insulator;

recessing said center electrodes below a bottom surface of said device layer;

etching laterally into said array insulating layer outside said trenches, thereby exposing a contact area on said bottom surface of said device layer;

depositing strap conductive material in said trenches to a level above said bottom surface of said device layer, whereby said strap conductive material makes electrical contact with said bottom surface to form said buried straps;

depositing top insulating material having a top insulator thickness extending up to a surface of said device layer in said trenches above said strap conductive material, whereby said top insulator thickness is approximately equal to said device layer thickness; and forming a set of isolating trenches by removing said device layer and said array insulating layer outside said trenches and said cell pass transistors, to a depth of at least said bottom of said buried straps, whereby only that portion of said buried strap inside said trenches and underneath said transistors remains and said buried straps are isolated from corresponding buried straps in adjacent cells by said isolating trenches;

forming a set of horizontal cell pass transistors in said device layer having cell electrodes, transistor gates disposed above said device layer and connected to a first subset of interconnect lines and internal electrodes in contact with said buried straps through said contact area and separated from an adjacent trench by said isolating trenches.

2. A method according to claim 1, further comprising a step of:

forming a first subset of interconnect lines contacting transistor gates in a said first subset of cells and extending over trenches in a said second subset of cells, said first subset of interconnect lines passing over and being separated vertically from said buried straps in said second subset of cells by said top insulator thickness; and forming a second subset of interconnect lines contacting transistor gates in said second subset of cells and extending over trenches in said first subset of cells, said second subset of interconnect lines being separated vertically from said buried straps in said first subset of cells by said top insulator thickness.

3. A method according to claim 1, further comprising a step of removing said strap conductive material in said trenches to a level below said bottom surface of said device layer, whereby said strap conductive material makes contact with said device layer only on said bottom surface and said top insulating material has a top insulator thickness greater than said device layer thickness.

4. A method according to claim 1, in which said step of etching laterally is performed by a substantially isotropic etch using fluorine chemistry.

5. A method according to claim 1, in which said top insulator has a thickness greater than 100 nm.

6. A method of making an integrated circuit having a device layer of semiconductor with a device layer thickness of less than 100 nm above an array insulating layer and containing an array of DRAM cells disposed in a first subset of DRAM cells and a second subset of DRAM cells, including a trench capacitor formed at an edge of said DRAM cells and connected by a buried strap to a horizontal pass transistor formed in said device layer and displaced laterally from said trench capacitor, said array of DRAM cells having at least some pairs of cells having a trench capacitor in a first cell separated by a portion of material from a corresponding trench capacitor in an adjacent cell, comprising the steps of:

forming said set of trench capacitors by etching trenches through said device layer and array insulating layer and depositing center electrodes insulated by a capacitor insulator;

recessing said center electrodes below a bottom surface of said device layer;

etching laterally into said array insulating layer outside said trenches, thereby exposing a contact area on said bottom surface of said device layer;

depositing a conformal liner of conductive material in said trenches to a level above said bottom surface of said device layer, whereby said liner of conductive material makes electrical contact with said bottom surface at the location where said buried strap meets said buried surface;

depositing strap conductive material in said trenches to a level above said bottom surface of said device layer, whereby said strap conductive material makes electrical contact with said bottom surface to form said buried straps;

depositing top insulating material having a top insulator thickness extending up to a surface of said device layer in said trenches above said strap conductive material, whereby said top insulator thickness is approximately equal to said device layer thickness; and forming a set of isolating trenches by removing said device layer and said array insulating layer outside said trenches and said cell pass transistors, to a depth of at least said bottom of said buried straps and filling said isolating trenches with an isolating material, whereby only that portion of said buried strap inside said trenches and underneath said transistors remains and said buried straps are isolated from corresponding buried straps in adjacent cells by said isolating material, and whereby said pairs of cells having a trench capacitor in a first cell separated by a portion of material from a corresponding trench capacitor in an adjacent cell are separated by said isolating material, so that the space available for passing wordlines comprises top insulators in said pairs of cells and said isolating trench;

forming a set of horizontal cell pass transistors in said device layer having cell electrodes, transistor gates disposed above said device layer and connected to a first subset of interconnect lines and internal electrodes in contact with said buried straps through said contact area and separated from an adjacent trench by said isolating trenches.

7. A method according to claim 6, further comprising a step of removing said strap conductive material in said trenches to a level below said bottom surface of said device layer, whereby said strap conductive material makes contact with said device layer only on said bottom surface and said top insulating material has a top insulator thickness greater than said device layer thickness.

8. A method according to claim 6, in which said step of etching laterally is performed by a substantially isotropic etch using fluorine chemistry.

9. A method according to claim 6, further comprising a step of:

forming a first set of wordlines contacting transistor gates in said first subset of cells and extending as passing wordlines over trenches in said second subset of cells, said first set of wordlines passing over and being separated vertically from said buried straps in said second subset of cells by said top insulator thickness; and forming a second set of wordlines contacting transistor gates in said second subset of cells and extending as passing wordlines over trenches in said first subset of cells, said second set of wordlines being separated vertically from said buried straps in said first subset of cells by said top insulator thickness.

* * * * *